(12) United States Patent
Mondello et al.

(10) Patent No.: US 11,568,942 B2
(45) Date of Patent: Jan. 31, 2023

(54) USING INTERNAL BLOCK VARIABLES AND KNOWN PATTERN INFORMATION TO PERFORM DYNAMIC ERASE OPERATION IN NON-VOLATILE MEMORY

(71) Applicant: Micron Technology, Inc., Boise, ID (US)

(72) Inventors: Antonino Mondello, Messina (IT); Alberto Troia, Munich (DE)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 16/625,587

(22) PCT Filed: May 31, 2019

(86) PCT No.: PCT/IB2019/000477
§ 371 (c)(1),
(2) Date: Dec. 20, 2019

(87) PCT Pub. No.: WO2020/240234
PCT Pub. Date: Dec. 3, 2020

(65) Prior Publication Data
US 2021/0407601 A1 Dec. 30, 2021

(51) Int. Cl.
*G11C 16/16* (2006.01)
*G11C 16/34* (2006.01)
*G11C 16/28* (2006.01)

(52) U.S. Cl.
CPC .......... *G11C 16/3445* (2013.01); *G11C 16/16* (2013.01); *G11C 16/28* (2013.01); *G11C 16/349* (2013.01)

(58) Field of Classification Search
CPC ..... G11C 16/3445; G11C 16/16; G11C 16/28; G11C 16/349
See application file for complete search history.

(56) References Cited

U.S. PATENT DOCUMENTS

| | | | |
|---|---|---|---|
| 9,449,698 B1* | 9/2016 | Paudel | G11C 16/3445 |
| 2002/0101765 A1* | 8/2002 | Mihnea | G11C 16/3404 |
| | | | 365/185.33 |
| 2008/0019182 A1* | 1/2008 | Yanagidaira | G11C 8/08 |
| | | | 365/185.19 |
| 2009/0106482 A1* | 4/2009 | Sarin | G06F 12/0246 |
| | | | 711/103 |
| 2009/0109756 A1* | 4/2009 | Aritome | G11C 16/10 |
| | | | 365/185.12 |

(Continued)

OTHER PUBLICATIONS

International Search Report and Written Opinion for related PCT Application No. PCT/IB2019/000477, dated Jan. 30, 2020, 14 pages.

*Primary Examiner* — Mushfique Siddique

(57) ABSTRACT

The abstract of the disclosure was objected to because of informality (e.g. format, reference to figures, etc.). See MPEP § 608.01 (b). Please amend the abstract to recite:

Non-volatile memory device may include at least an array of memory cells. The non-volatile memory cells may include associated decoding and sensing circuitry and a memory controller. Methods for checking the erasing phase of a non-volatile device may include performing a dynamic erase operation of at least a memory block and storing in a dummy row at least an internal block variable of the dynamic erase operation and/or a known pattern.

20 Claims, 7 Drawing Sheets

(56) References Cited

U.S. PATENT DOCUMENTS

| | | | | |
|---|---|---|---|---|
| 2009/0296471 | A1* | 12/2009 | Goda | G11C 16/06 |
| | | | | 365/185.11 |
| 2011/0145483 | A1* | 6/2011 | Sudo | G06F 12/0246 |
| | | | | 711/E12.001 |
| 2016/0099061 | A1* | 4/2016 | Ziperovich | G11C 16/16 |
| | | | | 365/185.11 |
| 2016/0342494 | A1* | 11/2016 | Yang | G11C 7/14 |
| 2021/0405910 | A1* | 12/2021 | Troia | G06F 3/064 |
| 2021/0407608 | A1* | 12/2021 | Mondello | G11C 29/028 |

* cited by examiner

FIG. 1 – PRIOR ART

USING INTERNAL BLOCK VARIABLES AND KNOWN PATTERN INFORMATION TO PERFORM DYNAMIC ERASE OPERATION IN NON-VOLATILE MEMORY

PRIORITY INFORMATION

This application is a National Stage Application under 35 U.S.C. § 371 of International Application Number PCT/IB2019/000477, filed on May 31, 2019, the contents of which are incorporated herein by reference.

TECHNICAL FIELD

The present disclosure generally relates to memory devices, and more particularly relates to methods for setting operating parameters of an integrated memory circuit.

More particularly, the present disclosure relates to a method for self-trimming operating parameters of a memory device and for checking the erasing phase of the memory device.

BACKGROUND

Memory devices are well known in the electronic field to store and allow accessing to digital information. In general, different kind of semiconductor memory devices may be incorporated into more complex systems including either non-volatile memory components as well as volatile memory components, for instance in so-called System-on-Chips (SoC) wherein the above-mentioned memory components are embedded.

Nowadays, however, the need of Real Time Operative Systems, for automotive applications requires SoC with more and more increased performances and efficiency and the known solutions no longer satisfy these requirements.

Non-volatile memory can provide persistent data by retaining stored data when not powered and can include NAND flash memory or NOR flash memory, among others. NAND flash has reduced erase and write times, and requires less chip area per cell, thus allowing greater storage density and lower cost per bit than NOR flash.

An important feature of a flash memory is the fact that it can be erased in blocks instead of one byte at a time. However, one key disadvantage of flash memory is that it can only endure a relatively small number of write and erase cycles in a specific block.

Flash memory devices can include large arrays of memory cells for storing data, frequently organized into rows and columns. Individual memory cells and/or ranges of memory cells can be addressed by their row and column. When a memory array is addressed, there may be one or more layers of address translation, to e.g., translate between a logical address utilized by a host device (i.e. the SoC) and a physical address corresponding to a location in the memory array.

Although uncommon, it is possible for the address information provided to a memory device on a command/address bus thereof to be corrupted by an error, such that an internal operation of the memory device (e.g., a read operation, a write operation, an erase operation, etc.) can be performed on a different physical address than was targeted by a host device or a controller of the memory device.

Accordingly, a way to verify that a memory operation has been performed at the intended address is required and the present disclosure is focused on methods for checking the correctness of the erasing phase.

DETAILED DESCRIPTION

Figure 1:
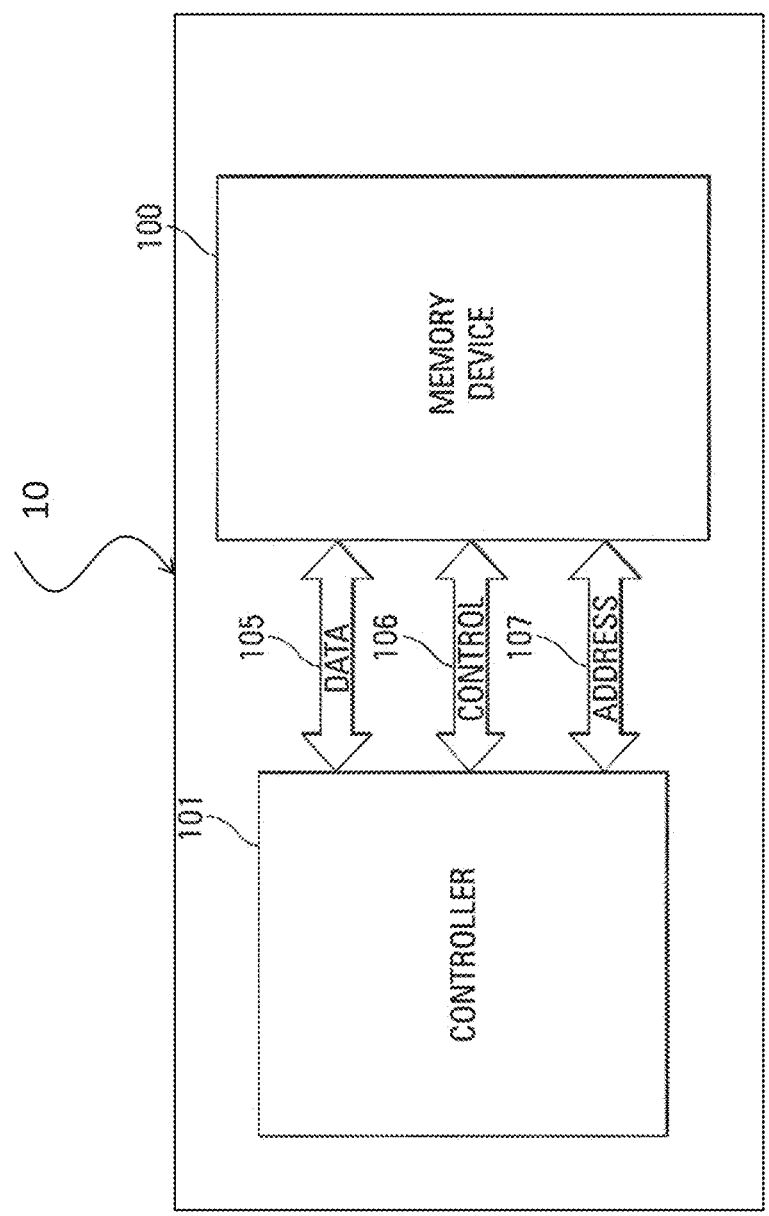
FIG. 1 shows a schematic view of a system including a memory component associated to a controller exchanging data, address and control signals with the memory device.

In the following detailed description, reference is made to the accompanying drawings that form a part hereof and in which is shown, by way of illustration, specific embodiments. In the drawings, like numerals describe substantially similar components throughout the several views. Other embodiments may be disclosed and structural, logical, and electrical changes may be made without departing from the scope of the present disclosure. The following detailed description is, therefore, not to be taken in a limiting sense.

Several embodiments of the present disclosure are directed to memory devices, systems including memory devices and methods of operating memory devices avoiding the potential problems of aging, temperature and process drift during memory operation.

In one embodiment of the present disclosure a new memory architecture is provided for an improved safety and performances of the data erasing phase in the non-volatile memory device.

More specifically, the present disclosure relates to a non-volatile memory device including at least an array of memory cells with associated decoding and sensing circuitry and a memory controller, wherein the memory array comprises:

a plurality of memory blocks;
at least a dummy row for each block located outside the address space of
each block for storing at least internal block variables of the erasing phase and at least a known pattern.

The above-mentioned internal block variables are parameters used also during the erasing phase of the memory block.

More specifically, the internal block variables are parameters such as the erase pulses and/or the target voltages applied to the memory block during the erasing phase.

Moreover, the internal block variables of a previous erasing phase are retrieved from said dummy row before starting the erase algorithm on the memory block.

For a better understanding of the present disclosure, it should be noted that Flash memories have developed into a popular source of non-volatile memory for a wide range of electronic applications.

Flash memories typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Single-Level Cells (SLC) sore a binary digit (e.g., a logic 0 or a logic 1); Multi-Level Cells (MLC) store more bits in the same physical cell, for example Triple-Level. Cells (TLC) store 3 bits of information using 8 threshold voltage levels.

When a memory array is addressed, there may be one or more layers of address translation, for instance a translation between a logical address used by a host device and a physical address corresponding to a location in the memory array. Such a mechanism is very useful to implements advanced features like block wear leveling and or factory/on field block redundancy.

Although uncommon, it may happen that an incomplete erase occurs during an erase operation. In such scenario it is very important to have a mechanism that allows the detection of blocks not well erased or incompletely erased. Since a not well erased block cannot be read or programmed, it would be extremely important to avoid any unexplained fail during a reading or programming phase on a block wherein an incomplete erase occurred.

In some embodiments at each power-up and/or reset phase and/or on user demand all the blocks in the array are verified to determine if some of them are in an incomplete erased condition. This can be done by verifying the presence of the pattern in the above-mentioned dummy row.

In case of incomplete erase detection:
a warning message to the host device is provided; and/or
an erase on such a block is done to recovery the block.
This could happen automatically or on host command.

For instance, a warning and/or recovery is triggered by detection that one of the blocks did not correctly complete the erase operation.

Moreover, it may happen that temperature variations inside a same device may generate reading drifts called ghost temperature issue.

The drawback connected to such temperature variations has an impact on the real bit distribution that is detected by the sense amplifiers as moved with respect to the ideal central value for which they have been programmed. Under some circumstances, such drifted and/or enlarged threshold voltage distributions may cause the same problems during reading as an incomplete erase operation, as it will appear from the following description.

Just to give a practical example, if the programming phase has been performed at −40° C., it may happen that at 120° C. the reading results include many errors. This is a real issue for all chips incorporated into automotive devices wherein a raising of the temperature during the operation of a vehicle must be taken in consideration.

Therefore, the reading phase of the memory device is never performed in environments conditions similar to the original programming phase; this is true also for the erasing phase.

A memory device may be defined a sort of "real time" device in the sense that if must release reliable data in all environment operation condition, no matter if it has been tested in the factory reporting an approval because of positive results of the test.

Moreover, the drift due to temperature is further increased by the age of the device and this problem could be particularly delicate for memory devices incorporated into System-on-Chip driving autonomous vehicles.

FIG. 1 illustrates a schematic example of a system 10 incorporating a flash memory device or component 100. The system also includes a memory controller 101 that is coupled to the memory device 100.

The controller 101 is shown coupled to the memory device 100 over a data bus 105, a control bus 106, and an address bus 107. In one embodiment, the data bus could be a 64 bit and/or 128 bit wide double data rate (DDR) bus.

The system device 10 shown in FIG. 1 can be a host device or a System-on-Chip coupled to the memory component 100, as will appear from the description of other embodiments of the present disclosure made with reference to other figures. In any case, the System-on-Chip 10 and the memory device 100 are realized on a respective die obtained by a different lithography and manufacturing processes.

Figure 2:
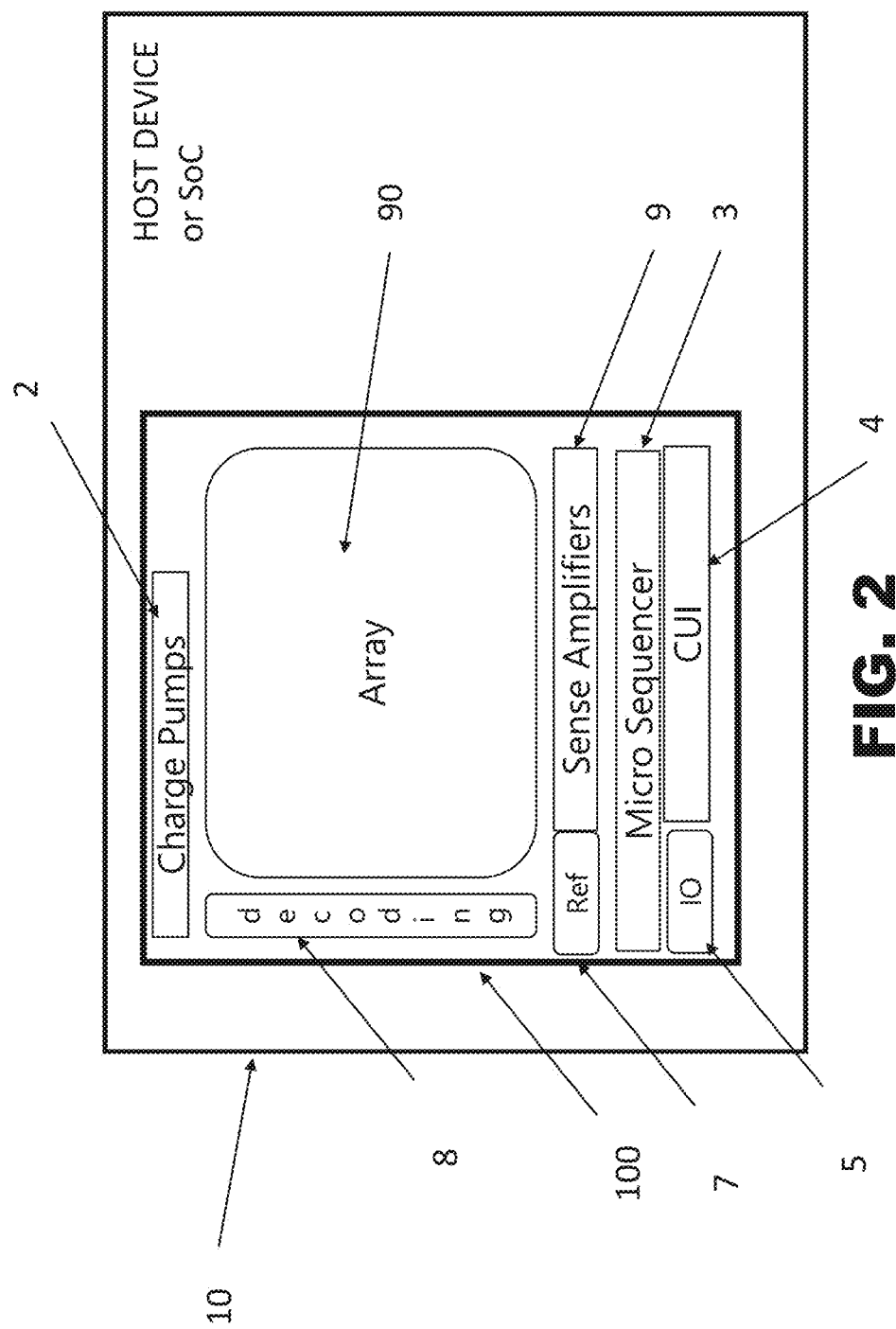
FIG. 2 is a schematic view of the memory component according to the present disclosure.

FIG. 2 is a schematic view of the memory component according to the present disclosure. The memory component 100 is an independent structure but it is strictly associated to the host device or to the SoC structure. More particularly, the memory device 100 is associated and linked to the SoC structure partially overlapping such a structure while the corresponding semiconductor area of the SoC structure has been used for other logic circuits and for providing support for the partially overlapping structurally independent memory device 100 for instance through a plurality of pillars or other similar alternative connections such as bumping balls or with a technology similar to Flip-Chip.

More specifically, this non-volatile memory component 100 includes an array 90 of Flash memory cells and a circuitry located around the memory array. The coupling between the SoC structure 10 and the memory component 100 is obtained by interconnecting a plurality of respective pads or pin terminals that are faced one toward the other in a circuit layout that keeps the alignment of the pads even if the size of the memory component is modified.

In one embodiment of the present disclosure, the arrangement of the pads of the memory component has been realized on a surface of the memory component 100, in practice on the top of the array. More specifically, the pads are arranged over the array so that, when the memory component 100 is reversed, its pads are faced to corresponding pads of the host or SoC structure 10. Signals of data (105), command (106) and address (107) busses are transferred through the pads described above; the pads may also be used for power supply voltages as well as other signals and/or voltages.

At the end, the memory device 100 is manufactured according to the user's needs in a range of values from at least 128 Mbit to 512 Mbit or even more. More specifically, the proposed external architecture allows to overpass the limit of the current eFlash (i.e. embedded flash technology) allowing the integration of bigger memory, as it can be 512 Mbit and/or 1 Gbit and/or even more depending on the memory technology and technology node.

With more specific reference to the example of FIG. 2, the main structure of the memory component 100 according to an embodiment of the present disclosure will be disclosed.

The memory component 100 includes at least: an I/O circuit 5, a micro-sequencer 3, an array of memory cells 90, voltage and current reference generators 7, charge pumps 2 and decoding circuitry 8 located at the array periphery or under the array, sense amplifiers 9 and corresponding latches, a command user interface, for instance a CUI block 4.

The array of memory cells 90 includes non-volatile Flash memory cells. The cells can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages and timing on the access and data lines.

To write and erase the memory cells of the Array 90 it is provided a dedicated logic circuit portion including a simplified Reduced Instruction Set Computer (RISC) controller or a Modify Finite State Machine or that is the logic circuit for handling the programming and erasing algorithms.

To read the memory cells of the Array 90 it is provided a dedicated circuit portion including an optimized Read Finite State Machine that is used to ensure high read performance, such as: branch prediction, fetch/pre-fetch, interrupt management, and so on. The error correction is left, as operation, to the SoC 10; the additional bits are provided to the controller 101 to store any possible ECC syndrome associated with the page. The ECC cells allows the host controller to understand if corruption is happening in the data plus address content.

Errors that affect address information provided to the memory device on a command or address bus can cause a memory operation to be performed on a different memory address than the desired address.

In this respect the controller is configured to receive a data word to be stored at an address in the array of memory cells. The controller is further configured to command the array to read the data word from the address, to receive response data from the array and to verify that the location indicia of the response data corresponds to the desired address.

If the location indicia do not correspond to the address, the controller is configured to indicate an error. This error is detected in metadata including ECC information.

ECC information is stored adjacent the data for which it provides error correction capabilities.

Figure 3:
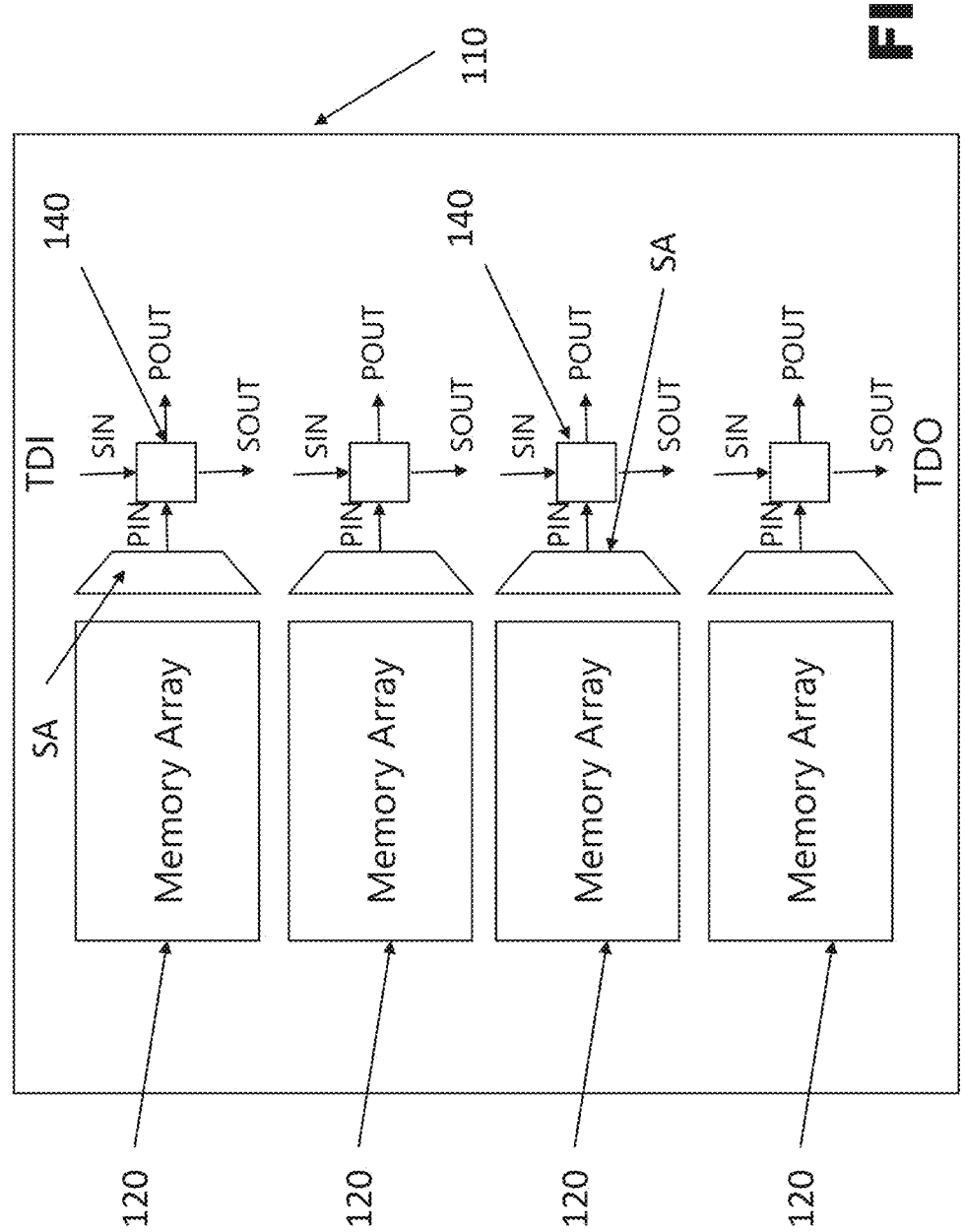
FIG. 3 is a schematic layout view of an example of the memory component according to embodiments of the present disclosure.

Coming now to a closer look to the internal structure of the memory component 100 it should be noted that the architecture of the array 90 is built as a collection of sub arrays 120, as shown schematically in FIG. 3.

The sense amplifiers SA at the output of each sub array 120 are connected directly to modified JTAG cells 140 to integrate a JTAG structure and the sense amplifiers in a single circuit portion. This allows reducing as much as possible the delay in propagating the output of the memory array to the SoC.

Figure 4:
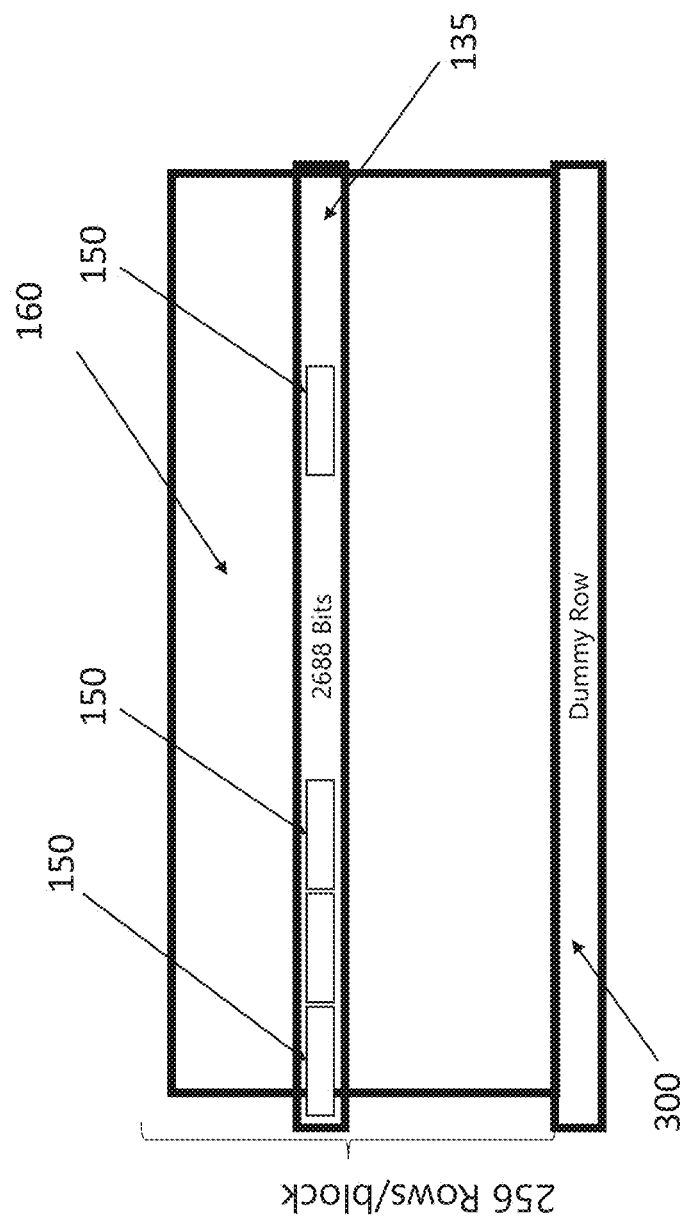
FIG. 4 is a schematic view of a memory block formed by a plurality of rows of the memory array according to one embodiment of the present disclosure.

Each sub-array 120 contains multiple memory blocks 160 that will be disclosed later with reference to FIG. 4.

In this manner, having smaller sectors if compared to known solutions the access time is significantly reduced and the whole throughput of the memory component is improved.

Each sub array 120 is independently addressable inside the memory device 100. Moreover, the memory array 90 is structured with, for example, at least four memory sub arrays 120 one for each communication channel with a corresponding core of the host device or SoC 10. A different number of cores and/or sub arrays may be used. The host device or the System-on-Chip 10 normally includes more than one core and each core is coupled to a corresponding bus or channel for receiving and transferring data to the memory component 100.

Therefore, in the present implementation each sub-array 120 has access to a corresponding channel to communicate with a corresponding core of the System-on-Chip 10.

It should be further noted that each subarray 120 includes address registers connected to data buffer registers, similarly to an architecture used in a DRAM memory device.

Moreover, according to one embodiment of the present disclosure at least a dummy row 300 is associated to each block 160 of the memory sub array 120.

This dummy row 300 is located outside the address space of the memory array 90 and is used for the optimization of the read, write and erase parameters.

Moreover, this dummy row is used for erase robustness monitor, for good completion of modify operations and others purpose.

According to another embodiment, the dummy row of a block 160 is provided in another block of the memory sub-array 120; this may allow to keep a single dummy row updated for a plurality of memory blocks that may be subject to same environmental variation conditions.

A skilled in this art may appreciate that such a dummy row may also be in a dedicated portion of the memory array (e.g., not in one of the sub arrays coupled to the SoC). Moreover, if the content of this "external" row is invalidated, then it will have to be up-dated, e.g., rewritten, so it will have to be erased, but such an operation implies erasure of the whole block where such an "external" row is located in a NAND memory.

Dummy row 300 may contain information useful for tracking parameters that may be used during the read and erase phases of the memory component 100 and/or to store some parameters for discovering a possible occurred incomplete erase.

The dummy row 300 contains a pattern that is known to the controller 101 of the memory device 100.

Let's suppose to record in the dummy row 300 a known pattern value like 0x55 or 0xAA in hexadecimal form. This value is particularly suitable since it includes the same amount of "0" logic values and "1" logic values that are stored inside the array in two distinct flash memory cells, with two different threshold values.

In a further embodiment, the above well-known pattern is not limited to a value in hexadecimal form such as 0x55 or 0xAA, for example, but it also includes an up-date of the erasing parameters such as for instance: amplitude/number of pulses in staircase and/or erase/depletion verify levels.

In any case, since those values are known a priori also by the memory controller, the system will perform some reading cycles changing the read trimming parameters up to the moment when the value will be read correctly. The changed trimming parameter of the correct reading will correspond to a set temperature value recorded in the programmable register. In case of multilevel cell memory (N levels), the values to be stored may be chosen to cover all the N levels present in the memory array. For example, the known pattern may include cells programmed in all the available levels of the Multi-Level Cell memory device.

Only when the trimming parameters set for the reading phase perfectly allow to retrieve the correct known value then the reading phase of the other memory blocks of the sub array 120 may be performed.

In one embodiment of the present disclosure the output of a generic sub-array 120 is formed by an extended page combining data cells, address cells and ECC cells. In this example, the total amount of Bits would involve 168 pads per channel as shown in FIG. 5.

The combined string of data cells+address cells+ECC cells allows implementing the whole safety coverage of the bus according to the standard requirements of the rule ISO26262, because the ECC covers the whole bus communication (data cells+address cells), while the presence of the address cells provide the confidence that the data is coming exactly from the addressed location of the controller.

Moreover, each memory sub array 120 is structured in memory block 160. The architecture of a memory block comprising each location of the memory array may be defined as extended page 150. An extended page is 128 bit I/O needed for the SoC and a 16 bit of ECC involving 24 bit addressing (up to 2G bit of available space).

Figure 5:
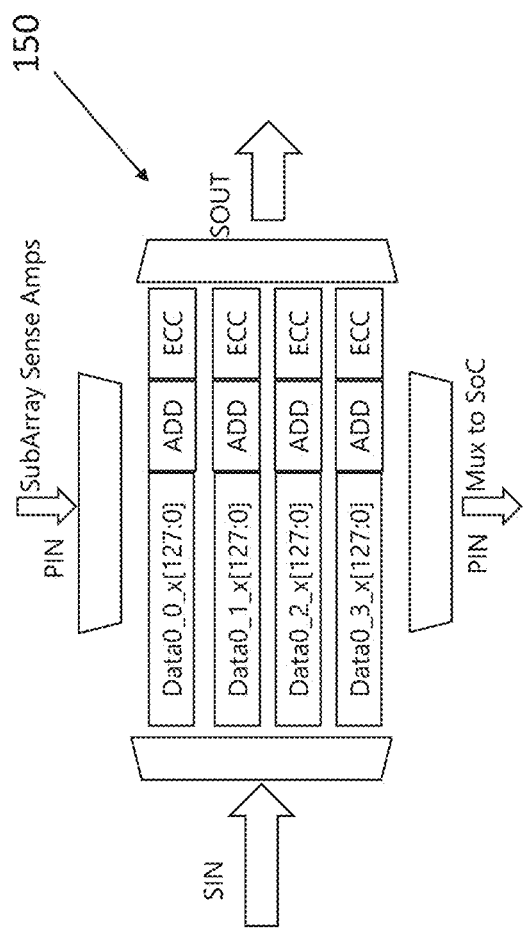
FIG. 5 is a schematic view of a group of address registers for a memory page in the memory component of the present disclosure.

A schematic view of the output of the sense amplifiers SA through the modified JTAG cells 140 is shown in FIG. 5 wherein it may be appreciated the composition of an extended page 150 with 168 Bits, as non-limiting example.

Said differently, the atomic page of 128 bits used in each sub-array 120 to fill the communication channel with the SoC device 10 has been enlarged in the present implementation to contain the stored address and the ECC forming an extended page of 168 Bits. Two extended pages 150 form a "super page".

Each memory block 160 contains 256 rows and each row 135 includes sixteen extended pages of the above size. Each super page includes a couple of 168 Bits as a combination of data, addressing and ECC Bits. Therefore, each row 135 of the memory array 90 can contain up to sixteen double pages of 128 bits each, plus the address and ECC syndrome spare bits per page.

Just to give a numeric value, an extended page is formed by 128+16+24=168 Bits and sixteen extended pages per each row 135 comprise 168*16=2688 bits.

Therefore, each row 150 of a memory block 160 includes at least sixteen pages comprising a memory word plus the corresponding address Bits and the corresponding ECC Bits. Obviously, another size can be selected and the reported value are just for illustration purpose of a non-limiting example. The outcome of the blocks is driven directly to the host device or SoC 10 without using high power output buffers and optimizing the path.

The idea at the bases of the present disclosure starts from the consideration that the temperature and aging drift affecting the memory array 90 may be detected by the memory component 100 itself using a stored reference.

By using the drift information of the well-known pattern stored, it is possible to set the best parameters to be used on the next erase operation. Such information can be used for correctly trimming all the voltage values and the timing (i.e. signal shape) to be used in each phase of erase algorithm.

In general, the right level of voltage and timing to be used in each erase phase must follow the technological guide line. Such guidelines are provided by Flash cells technologist as a map between the level of aging and the associate values voltage/timing to be used. According to such guidelines, a plurality of well known or predefined parameter may be defined a priori for the given technology. Such parameters may be further adjusted during electrical testing of the die to account for process variations, for example.

In a further embodiment of the present disclosure, even the parameters or the known patterns, adjusted or not, may be stored in the dummy row 300 are electrical wafer sort or at electrical testing, in some embodiments, and/or up-dated during operating life on the field, for example after erase operation is correctly completed.

Let's now see the erase procedure according to this methodology:

The well-known patterns are read from the dummy row 300 and elaborated by the internal controller in order to determine the best parameters to be used in the next steps. Then the erase algorithm can start.

If the parameters are not present in the dummy row 300 then it means that an incomplete erase occurred. This event must be recovered by erasing the whole block. Otherwise the block cannot be correctly programmed or read. The lack of parameters in the dummy row may be confirmed by a mismatch between a pattern (also normally present in the dummy row 300, as it will be explained in more detail below) and an expected known pattern.

Under normal operating conditions, to erase this kind of memory device, it is generally provided a pre-program phase, also known as program all0.

Normally, before starting the erasing phase, the thresholds of the cells to be erased are moved toward the program state. This is done by issuing some blind (i.e. without verify) program pulses.

With this procedure the number of pre-program pulses to be issued and/or the voltage to be used are chosen according to the previous reding step of the dummy row.

During an erase pulse phase, the voltage and pulse duration can be set to fast and safe erase the cells in the block (according to the previous erasing phase).

If the block is cycled (many program-erase cycles, estimated by using drift information) some appropriate strong voltages and pulses duration are used. Normally a block is erased by applying several erase pulses at different (negative for the gate voltage and/or positive for the body-source). This sequence is called staircase.

Once an erase pulse is issued (as above) the erase cells status is verified by applying a proper cell gate voltage value to be used to perform an erase verify, with enough margin, to guarantee a well erased cell distribution.

In other words, a first step #1 is based on erase pulses in the staircase while a second step #2 is based on an erase verify. The drift information can be used to select the right erase verify values.

Figure 6:
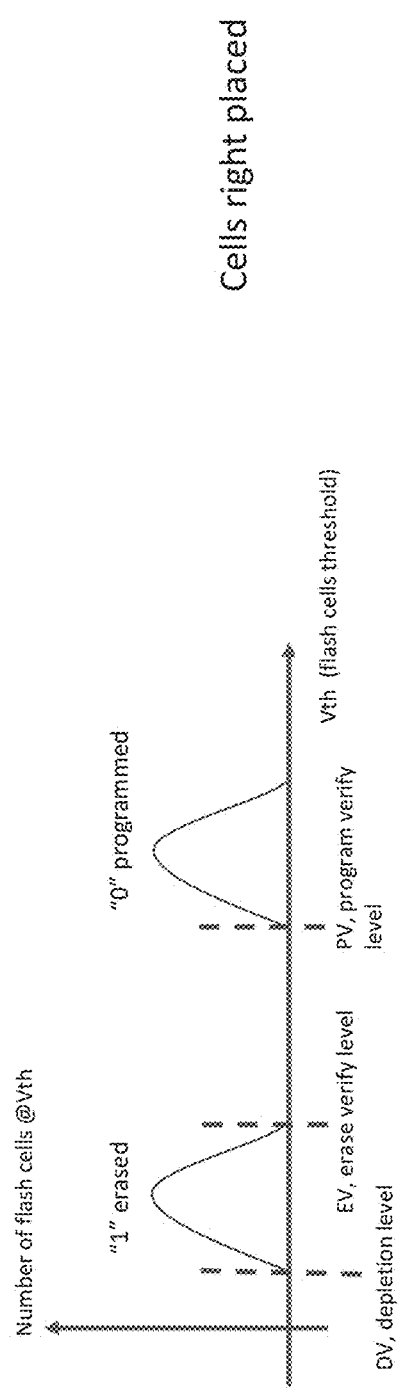
FIG. 6 shows in a schematic diagram the distribution of a good erased/programmed cell (1 bit/cell)

For instance, FIG. 6 shows in a schematic diagram the distribution of a correctly erased/programmed (1 bit/cell) cell. All the cell threshold population are correctly confined in the boundary assigned (i.e. programmed or '0' or erased '1'). The steps #1 and #2 (erase pulse and erase verify) are repeated up to all the cells satisfy the erase verify criteria.

Once all the cells are correctly (erased) verified, it is also checked if there are cells with a too low threshold. In the FIG. 6 this is shown by the label depletion verify, DV.

In case of depletion a soft-program operation is issued on the cells that need it. The parameters to be used to perform a soft-drift of the cells, in order to right place the thresholds inside the erase cell distribution can be chosen according the aging level of the cells.

A wrong selection of such a parameter can cause a bad placement of the cells' threshold outside the erased distribution (over the erase verify value) and this would imply that the block must be erased again starting from the above step #1 of providing the erase pulses (this would be a time consuming).

Once the erase is complete (the above phases are done) the well-known pattern or even the erasing parameters (i.e. amplitude/number of pulses in staircase and/or erase/depletion verify levels etc.) are written in the row 300 to be used on the next erase cycle. In particular, the pattern that was selected by the storing of the set values (0x55, 0xAA etc.) are programmed and verified (see the PV phase of FIG. 6)

accordingly by using an appropriate program pulse which voltage and timing are depending on the current aging level of the block.

By using the drift information and the number of erase pulses provided in the erase phase (step #1 above) it is possible to infer that a block is near to its end of life.

This information could be used as warning for the customer or as flag for internal algorithm in order to trigger a possible block wear leveling or OFBR (On Field Block Redundancy) operation, if implemented. OFBR consists in the replacing of the block with a spare one.

Figure 7:
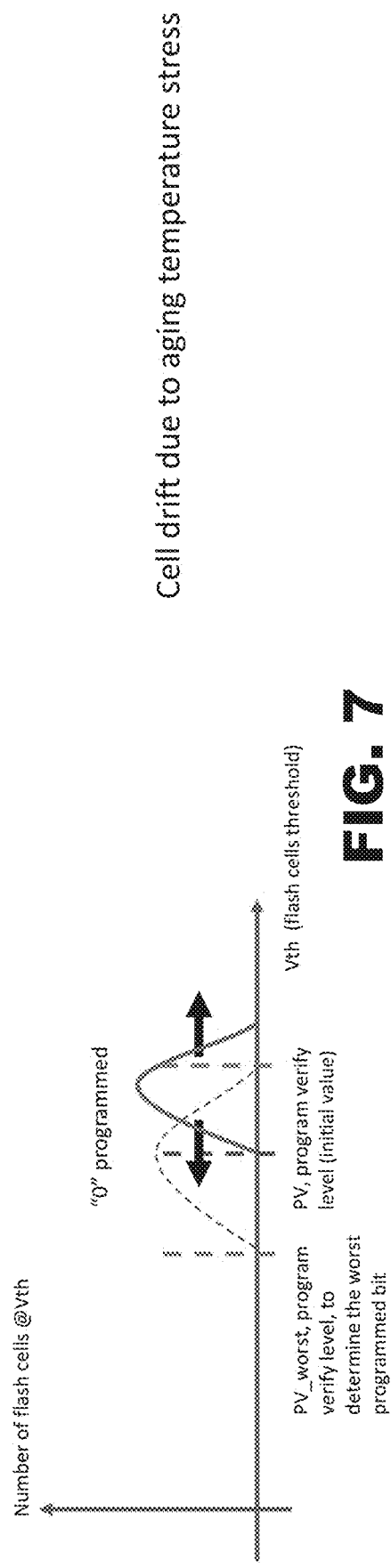
FIG. 7 shows a diagram corresponding to FIG. 6 reporting an enlarged distribution shifted toward the depletion state (negative Vth) due to aging, temperature and stress.

FIG. 7 shows a diagram corresponding to FIG. 6 but reporting an enlarged distribution due to aging, temperature and/or stress. With the aging, temperature and/or stress the threshold voltage distributions tend to enlarge. According to the methodology of the present disclosure it is possible to use the distribution enlargement to track the cells degradation and use this information to correct the next erase pulses. This permits to improve the reliability and the performances of the erase phase.

The trimming sequence to perform a reading phase of the memory array at different temperatures or different aging of the memory devices may be detected in a lab during the technology development phase and/or product testing and stored in a programmable register of the memory controller 101.

Similarly, a regulation of the parameters used during the erasing phase may be performed in the same manner during operation in the field.

For the content of a correct reading phase it is not important the real temperature value at which the reading phase is performed. Such a temperature could be higher (even much higher) or lower if compared to the level of temperature at which the programming phase of the known value has been performed.

The system is automatically protected by any thermal drift since the reading trimming parameters are selected after having performed the correct reading of the known sequence stored in the dummy row 300 and having set accordingly the trimming parameter for reading correctly that known value.

The procedure allows to identify the more suitable reading trimming parameters for a correct reading phase at a certain temperature value. It is not necessary to repeat such a procedure at each reading phase or access. On the contrary, such a procedure may be performed periodically or, in a more appropriate manner, when possible problems are detected, for example by the ECC bits increasing in an anomalous way.

It happens for instance that an increased number of ECC bits are reporting an excessive number of wrong reading from the memory device. In such a case, the system may automatically start the procedure for detecting a possible thermal drift and a consequent need to change the trimming parameters.

The dummy row 300 may be used also as indication for verifying a possible fail of the erase operation.

The method of the present disclosure allows to properly check the erasing phase of the memory component 1, or better of a memory block 160.

The method for erasing a non-volatile memory device including at least an array of memory cells and with associated decoding and sensing circuitry and a memory controller, comprises at least the following steps:
performing an erase operation of a memory block 160;
storing in a dummy row 300 of said memory block 160 at least internal block variables of the erasing phase and at least a known pattern.

Figure 8:
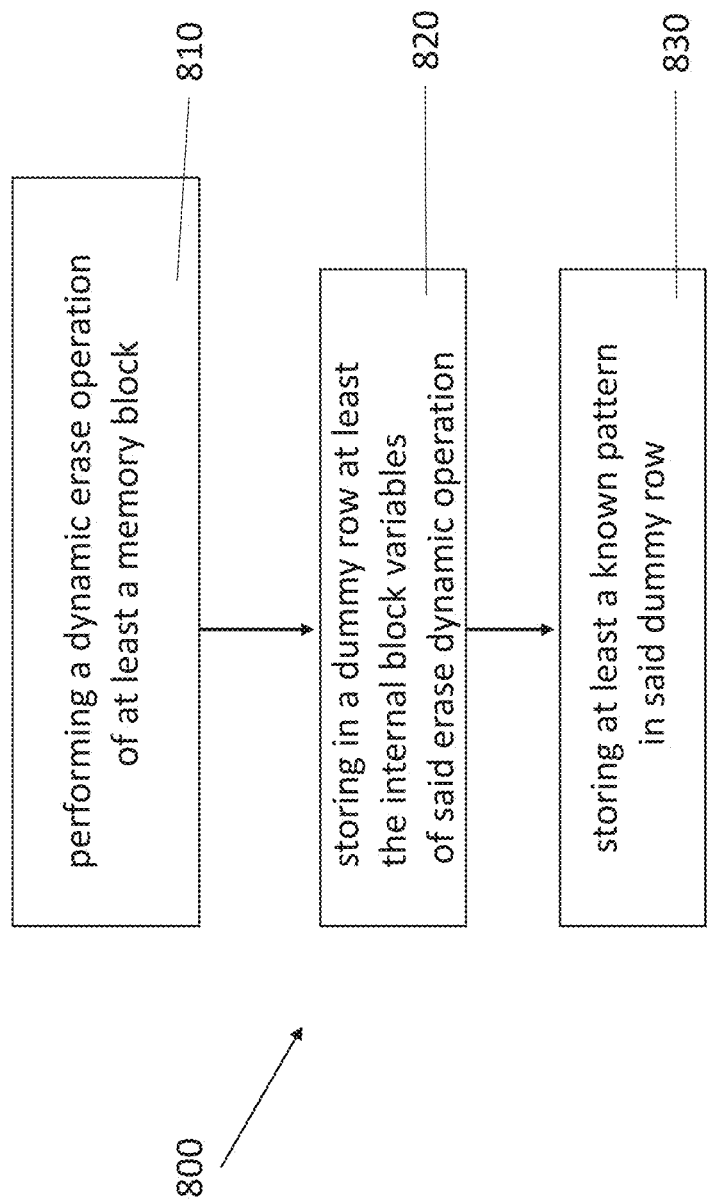
FIG. 8 shows in block diagram an example of the method steps of the present disclosure.

The above method phases are illustrated in the example of FIG. 8 that is a flow chart diagram 800 showing as a first phase 810 a dynamic erase operation of at least a memory block 160.

Then, in a subsequent phase 820 it is stored in the dummy row 300 at least the internal block variables of said erase operation.

Finally, in phase 830 it stored also at least the known pattern in said dummy row 300.

The first step of the erase algorithm is to invalidate the content of the dummy row for storing in the dummy row 300 the new erasing variables at the end of the erasing phase. To invalidate the content of dummy row 300 a flag or an invalid pattern may be programmed, or the entire row may be overwritten, for example.

The content of the dummy row 300 includes at least internal block variables meaning the parameters that are used during the erasing phase of the block, for instance: the erase pulses, the target voltages, etc.

Moreover, the content of the dummy row 300 includes also at least the known pattern, meaning the previously mentioned known hexadecimal value. As an alternative, example of known patterns is the following: 0x0, 0x1, 0x2, . . . 0xF or any other sequence that involves a number of bits set to zero and set to one in a similar amount, such as: 0x55, 0xAA, 0x33 etc. As previously mentioned, in case of Multi-Level Cells storing more than a single bit in one physical cell, a corresponding known pattern shall be chosen to account for correct detection of all possible threshold voltage levels.

The method of the present disclosure provides for performing the erase algorithm using the specific parameters. In other words, the internal block variables of a previous erasing phase are retrieved from said dummy row 300 before starting the erase algorithm on the memory block 160.

The completion of the erase algorithm is done storing the erase critical parameters and the known pattern.

The storage of the critical parameters can provide feedback on the healthiness of the block, determining also the way the wear leveling must be applied to the block 160 of the sub-array 220.

The presence of the known pattern at the end of the dummy row ensures the correctness of the operation.

In case it is not possible to correctly read the block variables and/or the known pattern when accessing the dummy row 300, e.g., in case the retrieving is unsuccessful, as it may happen if an incomplete erase event occurred during a previous erase operation before the erasing procedure had been correctly completed, a block recovery is triggered. The block recovery may comprise an erasing procedure according to predefined (e.g., factory defined) parameters. Accordingly, a blind pre-program phase is executed (to have all bits in an All0 state before the actual erasing pulse sequence). Then a staircase is applied to the bits of the interested block with increasing applied voltage steps interleaved with erase verify steps (using the predefined Erase Verify level) and finally a verification against the predefined Depletion Verify level is carried out, possibly followed by a soft program of depleted bits. The recovery erase procedure is completed by programming in the dummy row 300 of the block the known pattern for future use. The erase parameters may be stored in the dummy row 300, too.

The method of the present disclosure allows obtaining a dynamic erase verification of the erasing phase since it is possible obtaining a secure feedback of the correctness of the erase operation even in different operating environmental conditions.

The invention claimed is:

1. A non-volatile memory device, comprising:
an array of memory cells comprising:
a plurality of memory blocks; and
a plurality of dummy rows corresponding to each respective memory block of the plurality, wherein each dummy row is:
associated with a first address space that is outside a second address space of the corresponding memory block; and
configured to store internal block variables associated with an erasing phase, and a particular pattern; and
a controller coupled to the array of memory cells and configured to, for each dummy row of the plurality:
responsive to a power-up of the array of memory cells, determine whether the particular pattern is stored in the dummy row, wherein a determination that the particular pattern is not stored in the dummy row is indicative of an incomplete erase of the corresponding memory block; and
responsive to determining that the particular pattern is not stored in the dummy row, execute the erasing phase on the corresponding memory block.

2. The non-volatile memory device of claim 1, wherein the internal block variables are indicative of parameters of executing the erasing phase on the corresponding memory block.

3. The non-volatile memory device of claim 2, wherein the parameters of the erasing phase include erase pulses and target voltages applied to the corresponding memory block in association with the erasing phase.

4. The non-volatile memory device of claim 1, wherein the plurality of memory blocks comprises a subarray of the array of memory cells.

5. A system, comprising:
a host device;
a non-volatile memory device coupled to the host device and comprising an array of memory cells and a controller coupled to the array of memory cells, wherein the array of memory cells comprises:
a plurality of memory blocks;
a plurality of dummy rows corresponding to each respective memory block of the plurality, wherein each dummy row is:
associated with a first address space that is outside a second address space of the corresponding memory block; and
configured to store internal block variables associated with an erasing phase and a particular pattern; and
wherein the controller is configured to, for each dummy row of the plurality:
responsive to a power-up of the array of memory cells, determine whether the particular pattern is stored in the dummy row, wherein a determination that the particular pattern is not stored in the dummy row is indicative of an incomplete erase of the corresponding memory block; and
responsive to determining that the particular pattern is not stored in the dummy row, execute the erasing phase on the corresponding memory block.

6. The system of claim 5, wherein the controller is further configured to retrieve the internal block variables from the dummy row, wherein the internal block variables are associated with a previous execution of the erasing phase on the corresponding memory block.

7. The system of claim 6, wherein the controller is further configured to initiate execution of the erasing phase on the corresponding memory block in response to retrieval of the internal block variables.

8. The system of claim 5, wherein the dummy row is provided in another block of the plurality of memory blocks or in a dedicated memory portion of the array of memory cells.

9. The system of claim 5, wherein the internal block variables are indicative of parameters of executing the erasing phase on the corresponding memory block.

10. The system of claim 9, wherein the parameters of the erasing phase include erase pulses and target voltages applied to the corresponding memory block in association with the erasing phase.

11. The system of claim 5, wherein the plurality of memory blocks comprises a subarray of the array of memory cells.

12. A method, comprising:
executing an erasing phase on a memory block of an array of memory cells of a non-volatile memory device;
prior to a power-up of the array of memory cells, storing, in a dummy row corresponding to the memory block, internal block variables associated with the erasing phase and a particular pattern, wherein the dummy row is associated with a first address space that is outside a second address space of the corresponding memory block;
subsequent to the power-up of the array of memory cells, determining whether the particular pattern is stored in the dummy row, wherein a determination that the particular pattern is not stored in the dummy row is indicative of an incomplete erase of the corresponding memory block; and
responsive to determining that the particular pattern is not stored in the dummy row, executing the erasing phase on the corresponding memory block.

13. The method of claim 12, wherein executing the erasing phase includes performing a dynamic erase operation on the corresponding memory block.

14. The method of claim 13, further comprising invalidating content of the dummy row prior to performing the dynamic erase operation.

15. The method of claim 12, wherein storing the internal block variables includes storing parameters of executing the erasing phase on the corresponding memory block.

16. The method of claim 12, wherein storing the internal block variables includes storing data indicative of erase pulses and target voltages applied to the corresponding memory block in association with executing the erasing phase.

17. The method of claim 12, further comprising retrieving the internal block variables from the dummy row, wherein the internal block variables are associated with a previous execution of the erasing phase on the corresponding memory block.

18. The method of claim 17, further comprising initiating executing the erasing phase on the corresponding memory block in response to retrieving the internal block variables.

19. The method of claim 18, wherein initiating executing the erasing phase comprises recovering the corresponding memory.

20. The method of claim 19, wherein recovering the corresponding memory block includes erasing the corresponding memory block according to predefined parameters.

* * * * *